(12) United States Patent
Kim et al.

(10) Patent No.: US 8,461,919 B2
(45) Date of Patent: Jun. 11, 2013

(54) RADIO FREQUENCY SWITCH CIRCUIT

(75) Inventors: Yu Sin Kim, Daejeon (KR); Youn Suk Kim, Gyunggi-do (KR); Dong Hyun Baek, Seoul (KR); Sun Woo Yoon, Seoul (KR)

(73) Assignees: Samsung Electro-Mechanics Co., Ltd (KR); Korea Advanced Institute of Science and Technology (KR)

( * ) Notice: Subject to any disclaimer, the term of this patent is extended or adjusted under 35 U.S.C. 154(b) by 159 days.

(21) Appl. No.: 13/016,349

(22) Filed: Jan. 28, 2011

(65) Prior Publication Data

US 2011/0187417 A1 Aug. 4, 2011

(30) Foreign Application Priority Data

Feb. 1, 2010 (KR) .................. 10-2010-0009122

(51) Int. Cl.
H01L 25/00 (2006.01)
(52) U.S. Cl.
USPC .......................................... 327/565; 327/564
(58) Field of Classification Search
USPC .................. 327/365, 376, 377, 427, 564, 565
See application file for complete search history.

(56) References Cited

U.S. PATENT DOCUMENTS

| | | | | |
|---|---|---|---|---|
| 5,818,099 A | * | 10/1998 | Burghartz | 257/548 |
| 6,094,088 A | * | 7/2000 | Yano | 327/534 |
| 6,169,311 B1 | | 1/2001 | Iwasaki | |
| 7,890,063 B2 | * | 2/2011 | Ahn et al. | 455/78 |
| 8,058,922 B2 | * | 11/2011 | Cassia | 327/534 |
| 2008/0272824 A1 | | 11/2008 | Fu et al. | |

FOREIGN PATENT DOCUMENTS

| | | |
|---|---|---|
| KR | 20010021489 A | 3/2001 |
| KR | 20080050325 A | 6/2008 |

OTHER PUBLICATIONS

Office Action for KR 10-2010-0009122, dated Aug. 23, 2011.

* cited by examiner

Primary Examiner — Hai L Nguyen
(74) Attorney, Agent, or Firm — Lowe Hauptman Ham & Berner, LLP

(57) ABSTRACT

A radio frequency (RF) switch circuit in which an RF switch and a switch controller are formed on a single CMOS substrate and floating resistors are connected to a deep N type well substrate, an N type well substrate, and a P type well substrate to thereby increase linearity with respect to input power. In the RF switch having at least one NMOS (N type Metal Oxide Semiconductor) switch changing a transmission path of an RF signal, an N type terminal formed on a first deep N type well substrate receives driving power through a floating resistor, a P type terminal formed on a first P type substrate receives body power through a floating resistor, and the two N type terminals formed on the first P type substrate receive gate power through a floating resistor, and in the switch controller having at least one NMOS switch and at least one PMOS (P type Metal Oxide Semiconductor) switch controlling changing of a path of the RF switch, an N type terminal formed on a second deep N type well substrate and an N type terminal formed on the first N type substrate receive driving power through floating resistors.

3 Claims, 4 Drawing Sheets

RADIO FREQUENCY SWITCH CIRCUIT

CROSS-REFERENCE TO RELATED APPLICATIONS

This application claims the priority of Korean Patent Application No. 10-2010-0009122 filed on Feb. 1, 2010, in the Korean Intellectual Property Office, the disclosure of which is incorporated herein by reference.

BACKGROUND OF THE INVENTION

1. Field of the Invention

The present invention relates to a radio frequency (RF) switch circuit and, more particularly, to an RF switch circuit in which an RF switch and a switch controller are formed on a single CMOS substrate and floating resistors are connected to a deep N type well substrate, an N type well substrate, and a P type well substrate to thereby increase linearity with respect to input power.

2. Description of the Related Art

Recently, wireless communication terminals have been widely used thanks to the convenience of their use. Wireless communication terminals may employ an RF switch circuit in order to change a transmission path of an RF signal.

The RF switch circuit may include an RF switch for changing a signal path and a controller for controlling the RF switch.

The RF switch circuit has largely been made of compound semiconductor such as SOS (Silicon on Sapphire), SOI (Silicon on Insulator) or gallium-arsenide (GaAs), but recently, due to an increase in the fabrication cost and a CMOS (Complementary Metal Oxide Semiconductor) process and circuit design technique development, the RF switch circuit is increasingly fabricated through the CMOS process.

However, the CMOS process is disadvantageous in that an insertion loss increases due to high parasitic capacitance, and because a breakdown voltage is low, if the power of an input signal to the RF switch is large, the insertion loss further increases and linearity deteriorates.

SUMMARY OF THE INVENTION

An aspect of the present invention provides a radio frequency (RF) switch circuit in which an RF switch and a switch controller are formed on a single CMOS substrate and floating resistors are connected to a deep N type well substrate, an N type well substrate, and a P type well substrate to thereby increase linearity with respect to input power.

According to an aspect of the present invention, there is provided an RF switch circuit including: an RF switch having at least one NMOS (N type Metal Oxide Semiconductor) switch changing a transmission path of an RF signal; and a switch controller having at least one NMOS switch and at least one PMOS (P type Metal Oxide Semiconductor) switch controlling the changing of a path of the RF switch, wherein the NMOS switch of the RF switch includes an N type terminal formed on a first deep N type well substrate formed on a chip substrate and a P type terminal and two N type terminals formed on a first P type substrate formed on the first deep N type well substrate, wherein the N type terminal formed on the first deep N type well substrate receives driving power through a floating resistor, the P type terminal formed on the first P type substrate receives body power through a floating resistor, and the two N type terminals formed on the first P type substrate receive gate power through a floating resistor, the NMOS switch of the switch controller includes an N type terminal formed on a second deep N type well substrate formed on the chip substrate, and a P type terminal and two N type terminals formed on a second P type substrate formed on the second deep N type well substrate, the PMOS switch of the switch controller includes an N type terminal and two P type terminals formed on a first N type substrate formed on the chip substrate, and the N type terminal formed on the second deep N type well substrate and the N type terminal formed on the first N type substrate receive driving power through floating resistors.

The switch controller may include: an oscillator providing a reference signal; a charge pump converting a voltage level of the reference signal transferred from the oscillator; a decoder decoding a control bit transferred from an external source; and a level shifter shifting the level of the voltage which has been converted by the charge pump according to a decoded signal transferred from the decoder and providing the level-shifted voltage to the RF switch, wherein the oscillator, the charge pump, the decoder, and the level shifter comprise at least one NMOS switch and at least one PMOS switch, respectively.

The at least one NMOS switch of the RF switch may be an N-channel MOS FET (Field Effect Transistor) formed through a standard PMOS process.

The at least one NMOS switch and at least one PMOS switch of the switch controller may be an N-channel MOS FET and a P-channel MOS FET formed through a standard CMOS (Complementary Metal Oxide Semiconductor) process, respectively.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
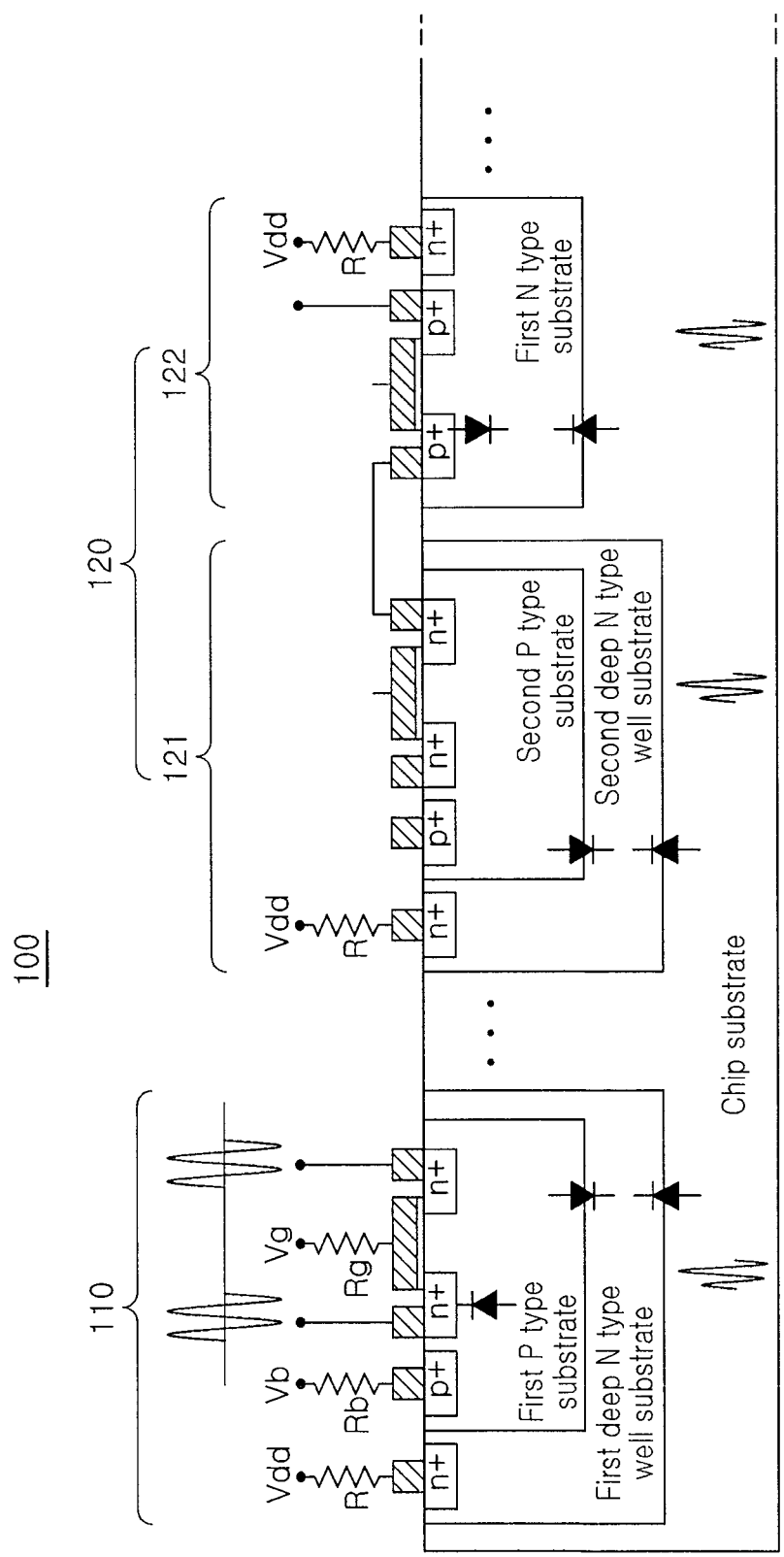
FIG. 1 illustrates the configuration of an RF switch circuit formed on a single substrate according to an exemplary embodiment of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions may be exaggerated for clarity, and the same reference numerals will be used throughout to designate the same or like components.

FIG. 1 illustrates the configuration of an RF switch circuit formed on a single substrate according to an exemplary embodiment of the present invention.

With reference to FIG. 1, an RF switch circuit 100 includes at least one N type MOSFET (Metal Oxide Semiconductor Field-Effect Transistor) provided at an RF switch 110, and at least one N type MOSFET 121 and at least one P type MOSFET 122 provided at a switch controller 120.

The at least one N type MOSFET provided at the RF switch 110 and the at least one N type MOSFET 121 and at least one P type MOSFET 122 provided at the switch controller 120 may be formed on the single substrate through a standard CMOS process.

The at least one N type MOSFET provided at the RF switch 110 may include an N type terminal formed on a first deep N type well substrate formed on a chip substrate, and a P type terminal and two N type terminals formed on a first P type substrate formed on the first deep N type well substrate.

The N type terminal formed on the first deep N type well substrate and the P type terminal and two N type terminals formed on the first P type substrate are connected with floating resistors R, Rb, and Rg. The N type terminal formed on the first deep N type well substrate may receive driving power Vdd through the floating resistor R, the P type terminal formed on the first P type substrate may receive body power Vb through the floating resistor Rb, and the two N type terminals formed on the first P type substrate may receive gate power Vg through the floating resistor Rg.

The at least one N type MOSFET 121 provided at the switch controller 120 may include an N type terminal formed on a second deep N type well substrate formed on the chip substrate, and a P type terminal and two N type terminals formed on a second P type substrate formed on the second deep N type well substrate. The N type terminal formed on the second deep N type well substrate may receive driving power Vdd through a floating resistor R.

The at least one P type MOSFET 122 provided at the switch controller 120 may include two P type terminals and one N type terminal formed on a first N type substrate formed on the chip substrate. The one N type terminal formed on the first N type substrate may receive driving power Vdd through a floating resistor (R).

Figure 2:
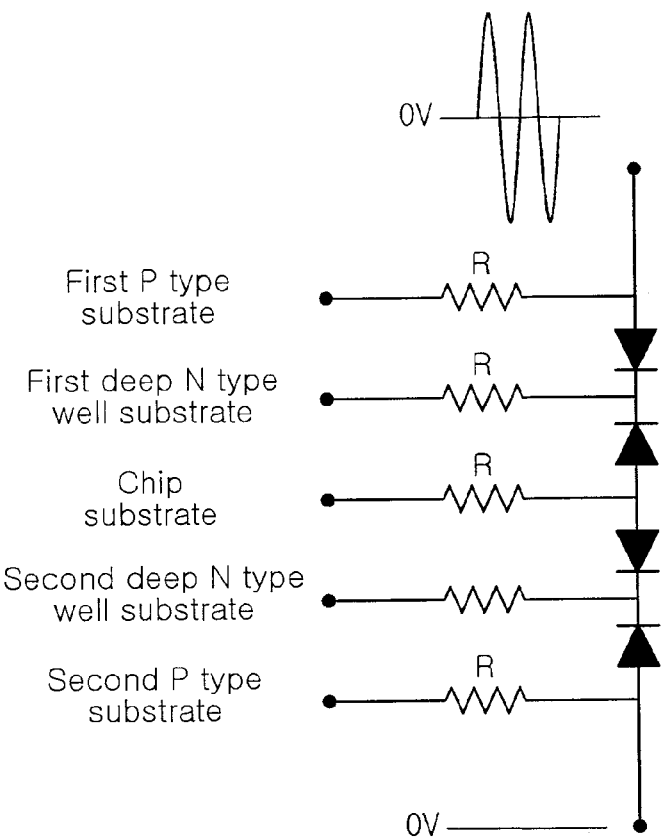
FIG. 2 is an equivalent circuit diagram of the RF switch circuit according to an exemplary embodiment of the present invention.

FIG. 2 is an equivalent circuit diagram of the RF switch circuit according to an exemplary embodiment of the present invention.

With reference to FIGS. 1 and 2, an input signal may be input to the RF switch 110 of the RF switch circuit 100 according to an exemplary embodiment of the present invention, and the input signal may be transferred to the switch controller 120 through the substrates.

Namely, as shown in FIG. 2, the input signal may be input to the N type terminal formed on the first P type substrate of the RF switch 110, which may be transferred to each substrate through a bulk diode of the P-N junction substrates. In this case, however, the floating resistors R, Rb, and Rg, connected to each terminal, may restrain the input signal from being transferred to the substrates. Thus, even when the input signal having a high power level is input, the RF switch 110 and the switch controller 120 formed through the standard CMOS process having a low breakdown voltage can operate normally.

That is, the withstanding voltage of the RF switch 110 by the foregoing bulk diode can be expressed by Equation (1) shown below:

$$VMAX = 2*(VDO+Vdd) + 1*(VDBR-Vdd) + 2*Vneg \quad \text{[Equation 1]}$$

(Where VMAX is a withstanding voltage, VDO is a drop voltage of the bulk diode, Vdd is driving power, VDBR is a breakdown voltage of the bulk diode, and Vneg is a charge pump voltage of the switch controller).

In general, when the bulk diode is formed according to a 0.18 um process, the withstanding voltage of the RF switch 110 may be substantially 25.4V.

Accordingly, a power level at which linearity can be maintained may be 38 dBm.

Figure 3:
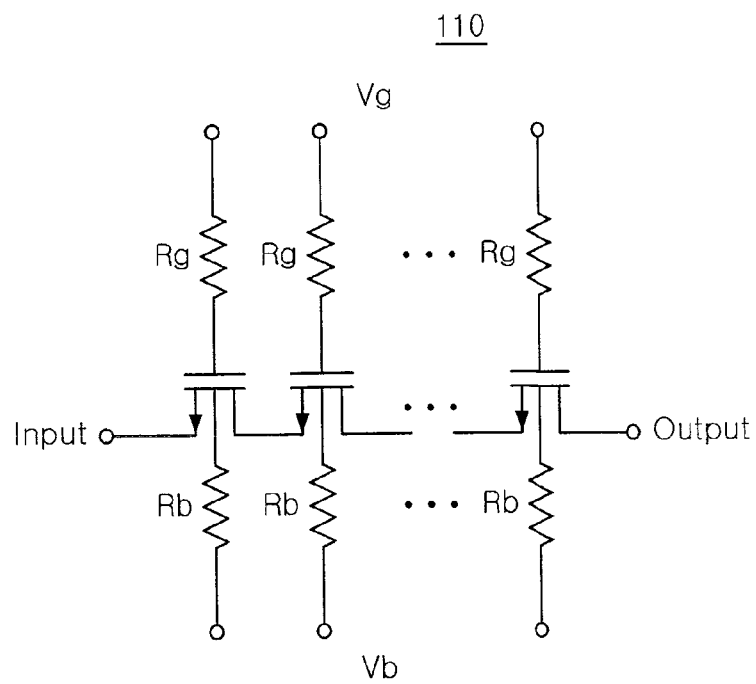
FIG. 3 is a view schematically showing the configuration of an RF switch employed in the RF switch circuit according to an exemplary embodiment of the present invention.

FIG. 3 is a view schematically showing the configuration of an RF switch employed in the RF switch circuit according to an exemplary embodiment of the present invention.

As shown in FIG. 3, the RF switch 110 may include a plurality of N type MOSFETs connected in parallel. Bodies and gates of the plurality of N type MOSFETs may be connected with the floating resistors Rb and Rg so as to receive the body power Vd or the gate power Vg.

Figure 4:
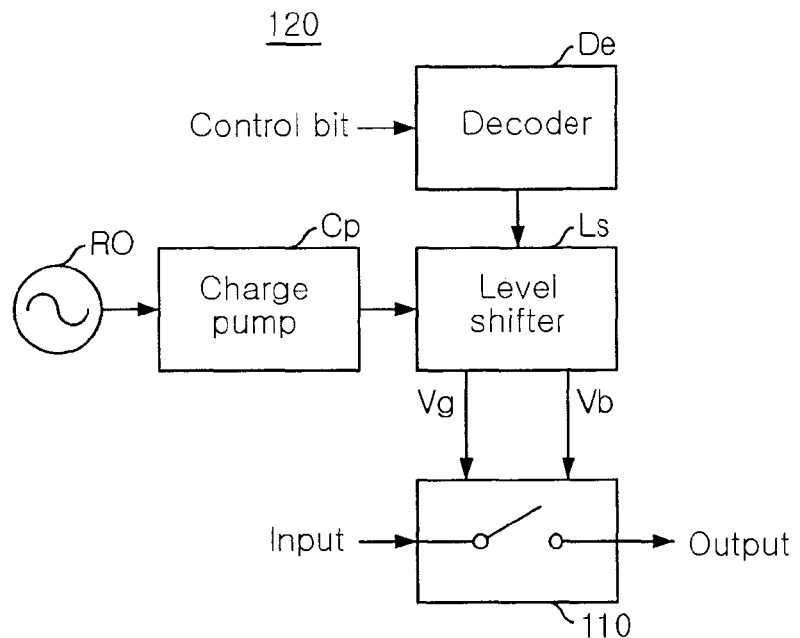
FIG. 4 is a view schematically showing the configuration of a switch controller employed in the RF switch circuit according to an exemplary embodiment of the present invention.

FIG. 4 is a view schematically showing the configuration of a limiter employed in the RF switch circuit according to an exemplary embodiment of the present invention.

As shown in FIG. 4, the switch controller 120 may include an oscillator RO, a charge pump Cp, a decoder D3, and a level shifter Ls. The oscillator RC may be configured as a known current starved ring oscillator and provide a pre-set reference signal.

The charge pump Cp may convert a voltage level of the reference signal transferred from the oscillator RO into pre-set power.

The decoder De may receive control bits from an external source, decode the received control bits, and transfer the decoded bits to the level shifter Ls.

The level shifter Ls may provide power which has been converted by the charge pump Cp according to the control bits which have been decoded by the decoder De, to the RF switch 110.

The foregoing switch controller 120 includes the oscillator RO, the charge pump Cp, the decoder De, and the level shifter Ls. The oscillator RO, the charge pump Cp, the decoder De, and the level shifter Ls may be configured to include the at least one N type MOSFET 121 and the at least one P type MOSFET 122, respectively. The configuration of the oscillator RO, the charge pump Cp, the decoder De, and the level shifter Ls by including the N type MOSFET and the P type MOSFET is a conventional technique, so a detailed description thereof will be omitted.

Accordingly, the switch controller 120 may be formed together with the RF switch 110 on the single chip substrate through the CMOS process, and because the floating resistors are connected with the corresponding terminals, even when the power level of an input signal is 30 dBm or higher, the linearity thereof can be maintained.

Figure 5:
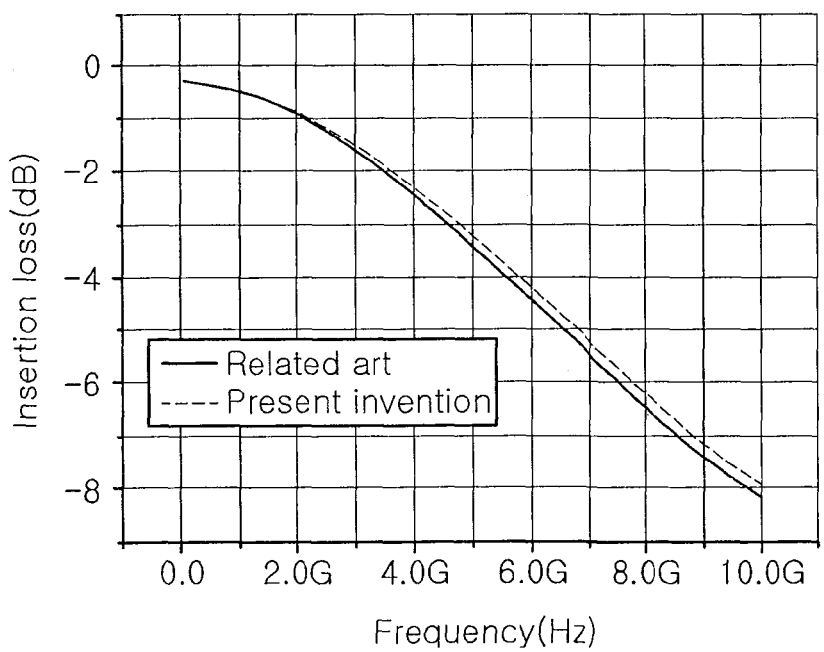
FIGS. 5 to 7 are graphs showing the characteristics of small signals according to an exemplary embodiment of the present invention.
Figure 6:
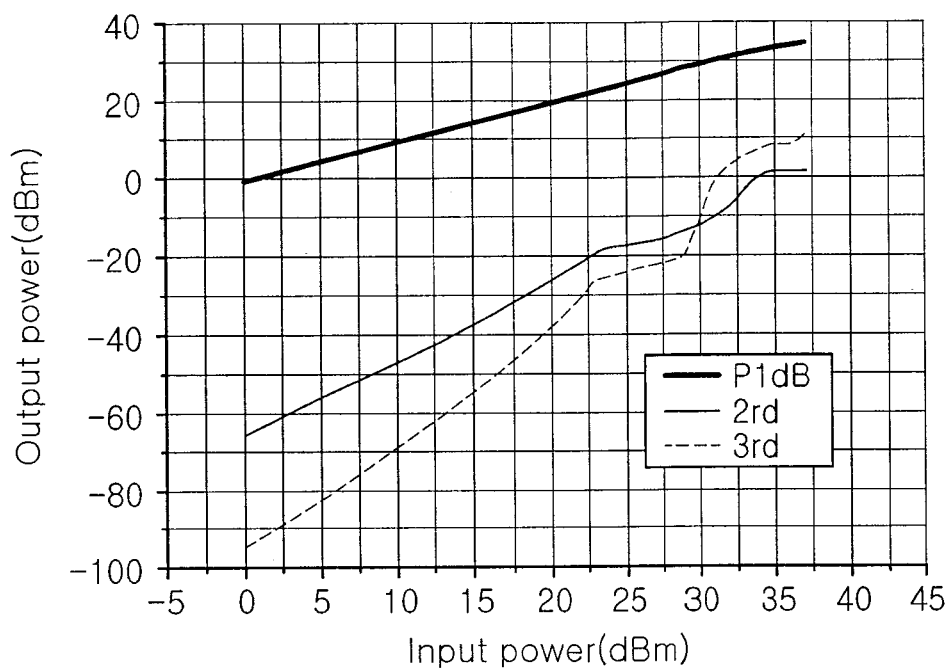
Figure 7:
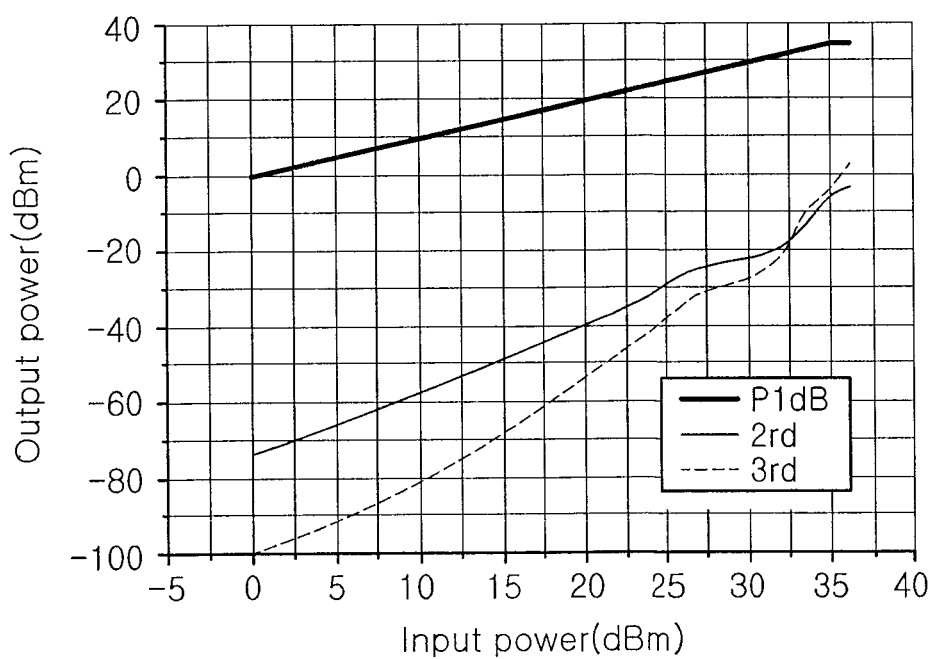

FIGS. 5 to 7 are graphs showing the characteristics of small signals according to an exemplary embodiment of the present invention.

As shown in FIG. 5, compared with the related art in which a floating resistor is formed only at the RF switch, it is noted that when floating resistors are connected with the PMOS FET and NMOS FET of the RF switch and the switch controller, an insertion loss is reduced.

FIG. 6 is a graph showing P1dB and secondary and tertiary harmonic components of the related art. As shown in FIG. 6, it is noted that linearity is unstable when a power level of an input signal is 30 dBm or higher, causing the secondary and tertiary harmonic components to sharply rise.

Meanwhile, FIG. 7 is a graph showing P1dB and secondary and tertiary harmonic components according to the present invention. As shown in FIG. 7, it is noted that linearity is stably maintained, even when a power level of an input signal is 30 dBm or higher, so the tilts of the secondary and tertiary harmonic components are gentle.

In this manner, in the present invention, when the RF switch and the switch controller are formed through the standard CMOS process, floating resistors are connected with the terminals of the NMOS FET constituting the RF switch to provide driving power, body power, and gate power, and driving power is provided to the N type terminals of the PMOS FET and NMOS FET constituting the switch controller through the floating resistors, whereby linearity can be maintained even at the 30 dBm considered as a limit of an input signal in the standard CMOS process.

As set forth above, according to exemplary embodiments of the invention, because the RF switch and the switch controller are formed on a single CMOS substrate and floating resistors are connected to a deep N type well substrate, an N type well substrate, and a P type well substrate, even when input power is high, an insertion loss can be reduced, and linearity can be increased.

While the present invention has been shown and described in connection with the exemplary embodiments, it will be apparent to those skilled in the art that modifications and variations can be made without departing from the spirit and scope of the invention as defined by the appended claims.

What is claimed is:

1. A radio frequency (RF), switch circuit comprising:
an RF switch including at least one first N-type metal oxide semiconductor (NMOS) switch configured to change a transmission path of an RF signal; and
a switch controller including at least one second NMOS switch and at least one P-type metal oxide semiconductor (PMOS) switch configured to control the RF switch, wherein
the at least one first NMOS switch includes
a first N-type terminal formed on a first deep N-type well substrate formed on a chip substrate, and
a first P-type terminal and two second N-type terminals formed on a first P-type substrate formed on the first deep N-type well substrate, wherein the first N-type terminal is configured to receive a driving power through a first floating resistor, the first P-type terminal is configured to receive a body power through a second floating resistor, and the two second N-type terminals are configured to receive a gate power through a third floating resistor,
the at least one second NMOS switch includes
a third N-type terminal formed on a second deep N-type well substrate formed on the chip substrate, and
a second P-type terminal and two fourth N-type terminals formed on a second P-type substrate formed on the second deep N-type well substrate,
the at least one PMOS switch includes a fifth N-type terminal and two third P-type terminals formed on a first N-type substrate formed on the chip substrate,
the third N-type terminal and the fifth N-type terminal are configured to receive driving powers through a fourth floating resistor and a fifth floating resistor, respectively,
the switch controller comprises:
an oscillator configured to provide a reference signal;
a charge pump configured to convert a voltage level of the reference signal from the oscillator;
a decoder configured to decode a control bit from an external source; and
a level shifter configured to shift the voltage level converted by the charge pump according to the decoded control bit from the decoder and to provide level-shifted voltage to the RF switch, and
each of the oscillator, the charge pump, the decoder, and the level shifter includes the at least one second NMOS switch and the at least one PMOS switch.

2. The RF switch circuit of claim 1, wherein the at least one first NMOS switch includes an N-channel metal oxide semiconductor field effect transistor (MOSFET) formed through a standard PMOS process.

3. The RF switch circuit of claim 1, wherein the at least one second NMOS switch and the at least one PMOS switch include an N-channel MOSFET and a P-channel MOSFET formed through a standard complementary metal oxide semiconductor (CMOS) process, respectively.

* * * * *